United States Patent [19]
Ohkura et al.

[11] Patent Number: 5,386,433
[45] Date of Patent: Jan. 31, 1995

[54] SEMICONDUCTOR LASER INCLUDING PERIODIC STRUCTURES WITH DIFFERENT PERIODS FOR PRODUCING A SINGLE WAVELENGTH OF LIGHT

[75] Inventors: Yuji Ohkura; Masatoshi Fujiwara, both of Itami, Japan

[73] Assignee: Mitsubishi Denki Kabushiki Kaisha, Tokyo, Japan

[21] Appl. No.: 58,371

[22] Filed: May 10, 1993

Related U.S. Application Data

[62] Division of Ser. No. 568,889, Aug. 17, 1990, Pat. No. 5,238,785.

[30] Foreign Application Priority Data

| | | | |
|---|---|---|---|
| Aug. 18, 1989 | [JP] | Japan | 1-213553 |
| Jun. 4, 1990 | [JP] | Japan | 2-146976 |
| Jul. 17, 1990 | [JP] | Japan | 2-189840 |

[51] Int. Cl.⁶ .............................................. H01S 3/08
[52] U.S. Cl. .................................... 372/96; 372/32
[58] Field of Search .................................. 372/96, 32

[56] References Cited

U.S. PATENT DOCUMENTS

| | | | |
|---|---|---|---|
| 4,366,235 | 12/1982 | Land | 430/496 |
| 4,665,528 | 5/1987 | Chinone et al. | 372/96 |
| 4,826,291 | 5/1989 | Utaka et al. | 350/320 |
| 4,847,857 | 7/1989 | Ohkura | 372/96 |
| 5,004,673 | 4/1991 | Vlannes | 430/325 |
| 5,020,072 | 5/1991 | Abe et al. | 372/96 |

FOREIGN PATENT DOCUMENTS 60-191209 9/1985 Japan.
228984 1/1990 Japan.

OTHER PUBLICATIONS

Striefer et al, "Coupling Coefficients For Distributed Feedback Single-And Double-Heterostructure Diode Lasers", IEEE Journal of Quantum Electronics, vol. OE-11, No. 11, Nov. 1975, pp. 867-873.

Johnson, "Optical Writing of Dense 1000-Å Features In Photoresist", Applied Optics, vol. 21, No. 11, 1 Jun. 1982, p. 1892.

"Production Of $\lambda/4$ Shift Diffraction Grating Using Phase Shift Film", 26p-T-8, Prescript of Autumn Meeting, 1986, Japanese Association of Applied Physics (no month).

"20-DFB Laser Arrays Fabricated By SOR Lithography", IOOC 1989, 21D3-1 (no month).

"$\lambda/4$ Shift Diffraction Grating Using Novolak Series Negative/Positive Resist", 2a-N-9, Prescript of Autumn Meeting, 1985, Japanese Association of Applied Physics (no month).

*Primary Examiner*—James W. Davie
*Attorney, Agent, or Firm*—Leydig, Voit & Mayer

[57] ABSTRACT

A single wavelength oscillating semiconductor laser device having at least two diffraction gratings in an active region in which the order of a first diffraction grating disposed in the center of the laser is higher than that of a second diffraction grating disposed in the neighborhood of resonator facets.

2 Claims, 8 Drawing Sheets

INTERFERENCE EXPOSURE

INTERFERENCE EXPOSURE

SEMICONDUCTOR LASER INCLUDING PERIODIC STRUCTURES WITH DIFFERENT PERIODS FOR PRODUCING A SINGLE WAVELENGTH OF LIGHT

This application is a division of application Ser. No. 07/568,889, filed Aug. 17, 1990 now U.S. Pat. No. 5,238,785.

FIELD OF THE INVENTION

The present invention relates to a method for manufacturing a diffraction grating and to a single wavelength oscillating semiconductor laser and, more particularly, to a method for manufacturing a diffraction grating having two different periods formed at the same time and to a single wavelength oscillating semiconductor laser having high linearity between light output and injected current and a highly stable single wavelength oscillation.

BACKGROUND OF THE INVENTION

FIG. 7 is a view showing an interference exposure apparatus used for manufacturing a conventional diffraction grating. Referring to FIG. 7, a laser beam 17a is output from a laser beam source 4. The laser beam 17a is divided into laser beams 17b and 17c by a half mirror 5 and the laser beams 17b and 17c are reflected by mirrors 6a and 6b, respectively, and then applied to a resist 2 on a substrate 1.

FIGS. 8(a), 8(b), 8(d), and 8(e) are cross-sectional views showing steps in conventional manufacture of a diffraction grating using an interference exposure method and FIG. 8(c) is a diagram showing a distribution of exposure light intensity.

Referring to FIG. 8(a), a resist 92 is applied to a substrate 91. Referring to FIG. 8(b), the resist 92 is exposed by a two-beam interference exposure method. Referring to FIG. 8(c), the exposure light intensity of a laser beam applied to the resist 92 varies periodically. Referring to FIG. 8(d), when the exposed resist 92 is developed, the resist 92 is patterned and a diffraction grating 93a is formed. Thereafter, referring to FIG. 8(e), the substrate 91 is etched away using the patterned resist 92 as a mask and then a diffraction grating 93b is formed.

According to the device shown in FIG. 7, the laser beam 17a output from the laser beam source 4 is divided into two beams by the half mirror 5 that are reflected by the mirrors 6a and 6b and meet again on the substrate 1. At this time, the intensity of the light on the substrate has a distribution with a period $\Lambda$ because of the interference of the two beams. The period $\Lambda$ is represented by:

$$\Lambda = (\lambda/(2 \sin \theta))$$

where $\lambda$ is the wavelength of the laser beam and $\theta$ is the incident angle of the laser beam on the substrate.

The conventional diffraction grating is formed using the above principle in which the resist applied to the substrate is exposed with interference fringes of light having a period $\Lambda$. Then the resist is developed and the substrate is etched away using the patterned resist as a mask.

FIG. 9 is a sectional view showing a conventional single wavelength semiconductor laser device disclosed in *Optics*, Volume 15, Number 2, pages 115-121. In FIG. 9, an n-type InGaAsP guide layer 107, an InGaAsP active layer 108, and a p-type InP layer 109 are sequentially formed on an n-type InP substrate 101 in which a diffraction grating 102 having a central phase shift region is present. An n side electrode 110 is provided on a back surface of the substrate 101 and a p side electrode 111 is provided on the p-type InP layer 109. In addition, a non-reflective coating film 113 is provided on each end surface 114 of the laser.

In the semiconductor laser device, electrons in the n-type InP substrate 101 and holes in the p-type InP layer 109 are injected into the InGaAsP active layer 108 and then emissive recombination occurs. In the distributed feedback (DFB) laser device having the diffraction grating 102 with the phase shift region in an active region, the light generated by the emissive recombination is reflected by the diffraction grating 102 and oscillates within the laser element whereby laser light is produced.

Since the diffraction grating 102 effectively reflects light having a wavelength $\lambda$ where $\lambda = 2n_{eff}\Lambda/n$ ($n_{eff}$ is the equivalent refractive index, $\Lambda$ is the period of the diffraction grating, and n is an integer), the oscillation wavelength is the wavelength with the largest gain in the active region among wavelengths represented by 2 $n_{eff} \Lambda/n$. As for the oscillation wavelength $\lambda$, when $n=1$, the diffraction grating is called a primary diffraction grating, and when $n=2$, the diffraction grating is called a secondary diffraction grating.

In the single wavelength oscillating semiconductor laser device having the structure shown in FIG. 9, since the light is reflected only by the diffraction grating 102 in the active region and then confined within the element, light intensity in the center of the element is increased. As a result, the linearity between light output and injected current and the stability of single wavelength oscillation are reduced by melting part of the laser.

As described above, according to the conventional method for manufacturing a diffraction grating, it is not possible to form a diffraction grating having a period which is less than one-half the wavelength $\lambda$ of the laser beam source 4.

In addition, according to the conventional single wavelength oscillating semiconductor laser, the linearity of the light output relative to injected current and the stability of the single wavelength oscillation is reduced by the melting part of the laser.

SUMMARY OF THE INVENTION

The present invention is directed to solving the above problems and has for its object providing a method for manufacturing a diffraction grating by which a diffraction grating with a short period can be formed.

It is another object of the present invention to provide a single wavelength oscillating semiconductor laser device having high linearity between light output and injected current and a stable single wavelength oscillation.

It is a further object of the present invention to provide a method for manufacturing a diffraction grating by which diffraction gratings having two different periods can be formed on the same plane using a single interference exposure.

A method for manufacturing a diffraction grating according to the present invention comprises applying a resist that has an extreme developing speed at a certain exposure light intensity to a substrate on which the diffraction grating is to be formed, exposing the resist with interference fringes of light having light intensities larger and smaller than the intensity that produces the extreme developing speed, and etching the substrate using a pattern which is obtained by developing the resist as a mask. As a result, a diffraction grating having a period which is one-half the period of the interference fringes of the exposure light is produced.

In a single wavelength oscillating semiconductor laser device according to the present invention, the order of a diffraction grating in the center of an element is higher than that of a diffraction grating in the neighborhood of resonator facets. Therefore, light intensity is not increased in the center of the element and excellent linearity between light output and injected current and a highly stable single wavelength oscillation are achieved.

In addition, a method for manufacturing a diffraction grating according to the present invention comprises applying a resist that has an extreme developing speed at a certain exposure light intensity to a substrate on which the diffraction grating is to be formed, partially covering the resist with a semi-transparent mask, exposing the resist with interference fringes of light having intensities larger and smaller than the intensity that produces the extreme developing speed in either a portion covered with the semi-transparent mask or another portion, and etching the substrate using a pattern that is obtained by developing the resist as a mask. As a result, two diffraction gratings having different periods can be formed with a single interference exposure.

Other objects and advantages of the present invention will become apparent from the detailed description given below. It should be understood, however, that the detailed description and specific embodiments are given by way of illustration only since various changes and modifications within the spirit and scope of the invention will become apparent to those skilled in the art from this detailed description.

DESCRIPTION OF THE PREFERRED EMBODIMENTS

Figure 1A:
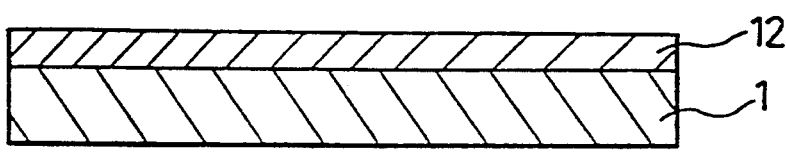
FIGS. 1(a), 1(b), 1(d), and 1(e) are cross-sectional views showing steps in manufacturing a diffraction grating in accordance with a first embodiment of the present invention
Figure 1B:
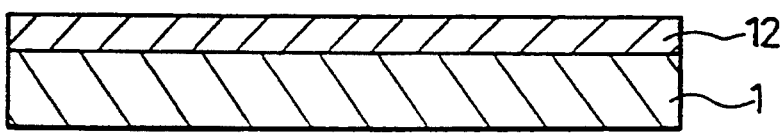
Figure 1C:
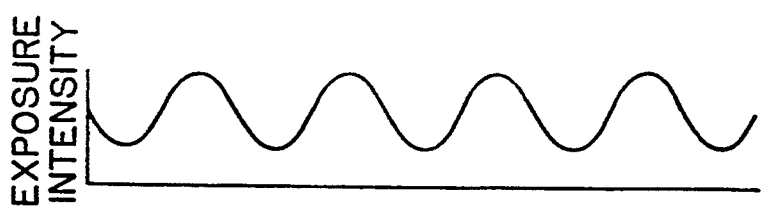
FIG. 1(c) is a diagram showing a distribution of exposure light intensity.
Figure 1D:
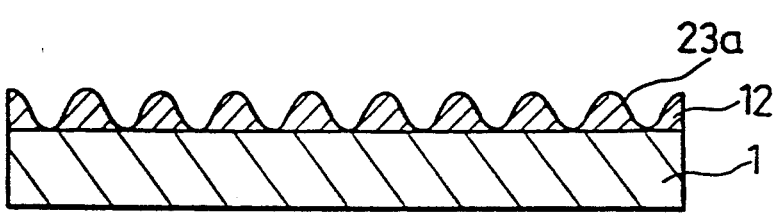
Figure 1E:
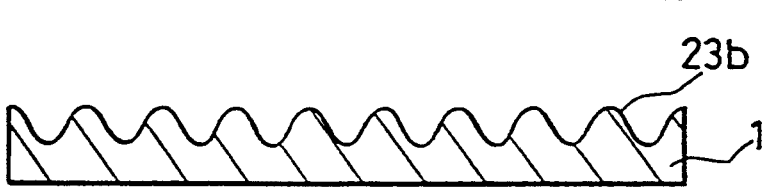

FIGS. 1(a), 1(b), 1(d) and 1(e) are cross-sectional views showing steps in manufacturing a diffraction grating in accordance with a first embodiment of the present invention and FIG. 1(c) is a diagram showing the distribution of exposure light intensity.

In FIG. 1(a), an image-reversible resist 12 having a developing speed that has a minimum value at a certain exposure light intensity is applied to a substrate 1. The image-reversible resist 12 is applied to the substrate 1 where the diffraction grating is to be formed and is baked at a temperature of 110° to 120° C. for five minutes before exposure so that the developing speed has a minimum value at a certain exposure light intensity. Then, referring to FIG. 1(b), the resist 12 is exposed by the two-beam exposure method with interference fringes of light having intensities larger and smaller than the intensity at which the developing speed has a minimum value. FIG. 1(c) is a diagram showing the distribution of the exposure light intensity. Then, referring to FIG. 1(d), the resist 12 is developed so that the portions of the resist exposed with the light intensity that produces the minimum developing speed are left and patterned to form a diffraction grating 23a. Then, referring to FIG. 1(e), the substrate 1 is etched with an appropriate etchant, such as an HBr/HNO$_3$/H$_2$O solution, an HBr/HNO$_3$/CH$_3$OH solution, or a Br$_2$/CH$_3$OH solution using the patterned resist 12 as a mask to form a diffraction grating 23b.

Figure 5:
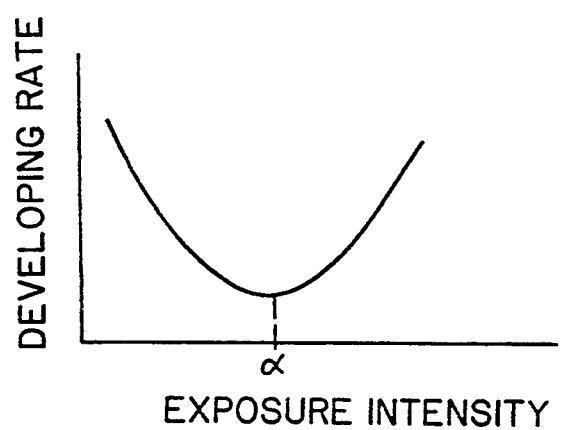
FIG. 5 is a diagram showing the relationship between exposure light intensity and developing speed of an image-reversible resist after it is baked at a temperature of 110° to 120° C.
Figure 6:
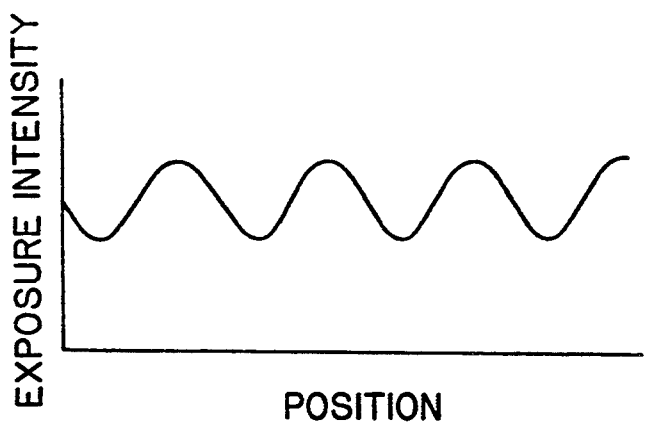
FIG. 6 is a diagram showing a distribution of exposure light intensity in an interference exposure method.
Figure 7:
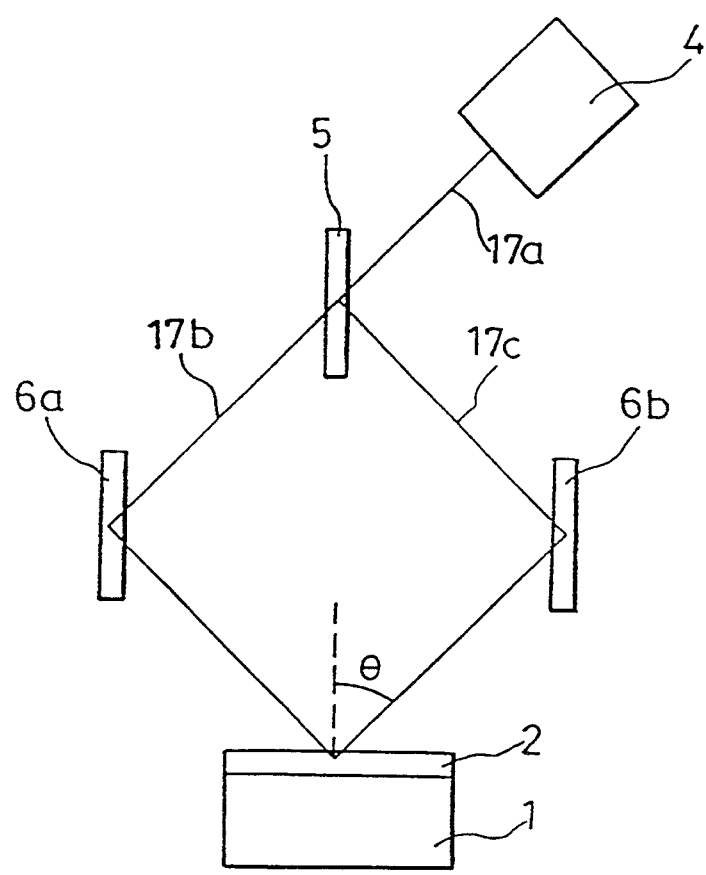
FIG. 7 is a view showing an interference exposure apparatus.
Figure 8A:
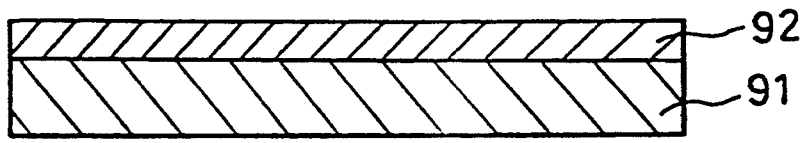
FIGS. 8(a), 8(b), 8(d), and 8(e) are cross-sectional views showing steps in manufacturing a diffraction grating by a conventional method
Figure 8B:
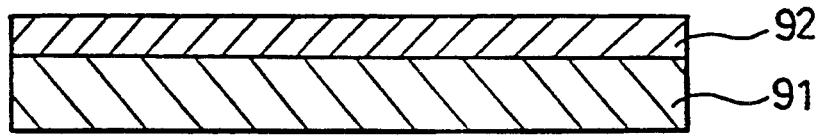
Figure 8C:
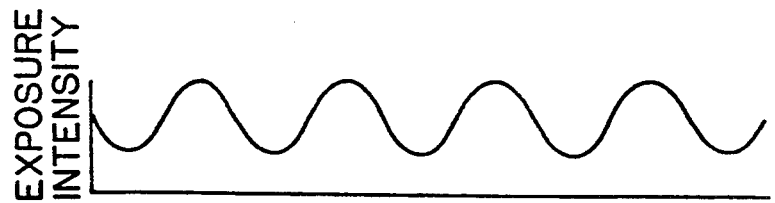
FIG. 8(c) is a diagram showing a distribution of exposure light intensity.
Figure 8D:
Figure 8E:
Figure 9:
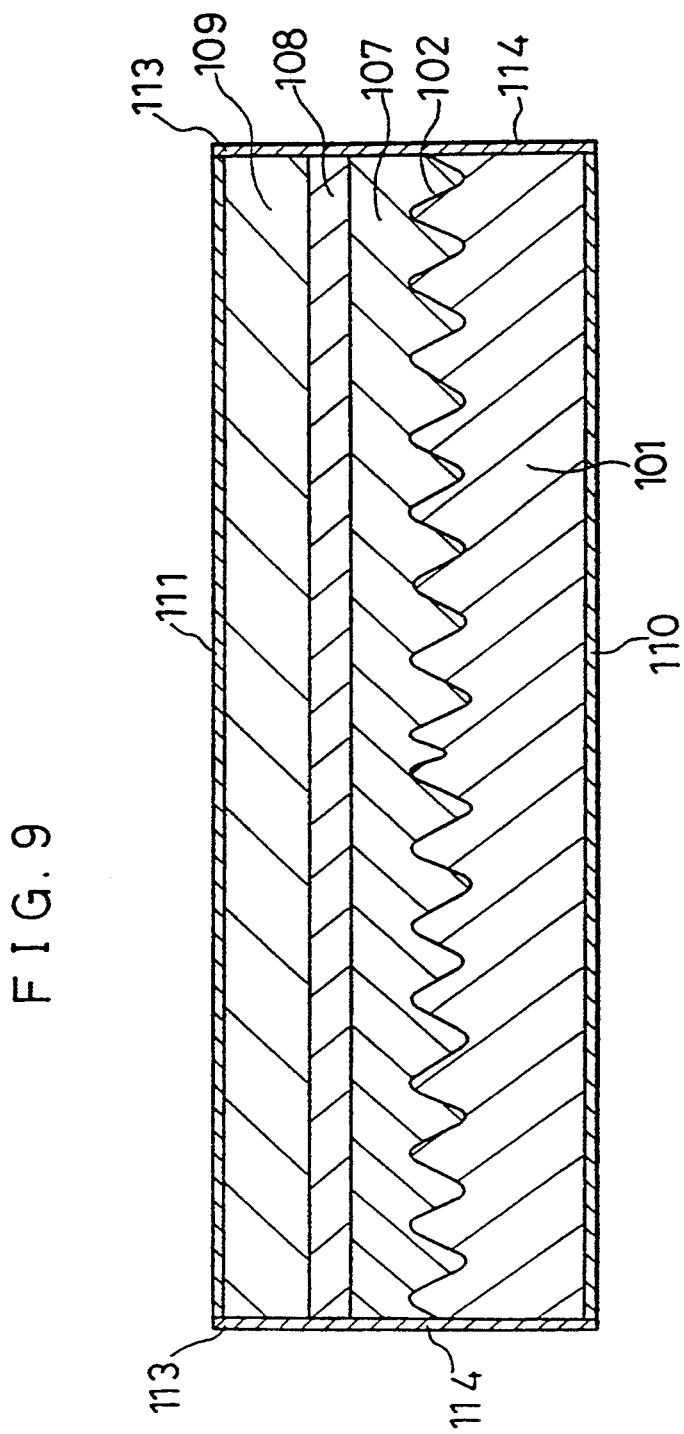
FIG. 9 is a sectional view showing a conventional single wavelength oscillating semiconductor laser device.

It is known that when an image-reversible resist is baked at a temperature of 110° to 120° C. before exposure, the developing speed has a minimum value at an exposure light intensity of $\alpha$, as shown in FIG. 5 (referring to "Electron Material" June 1986). The exposure light intensity in the interference exposure method has a cyclic distribution, as shown in FIG. 6. The period of the distribution is the $\Lambda$ of the above equation. Therefore, when the resist is exposed so that the maximum exposure light intensity is larger than the intensity at which the developing speed has the minimum value (at a point $\alpha$ in FIG. 5), and the minimum exposure light intensity is less than the intensity at point $\alpha$, and the resist is developed, the portions of the resist exposed with the intensity that makes the developing speed a minimum value are left. As a result, after etching, it is possible to form a diffraction grating having a period which is one-half the period of the interference fringes used in the interference exposure method.

Although a description was given of a resist in which developing speed has a minimum value with regard to a certain exposure light intensity, the same effect can be attained if the resist developing speed has a maximum value with regard to a certain exposure light intensity.

Figure 2:
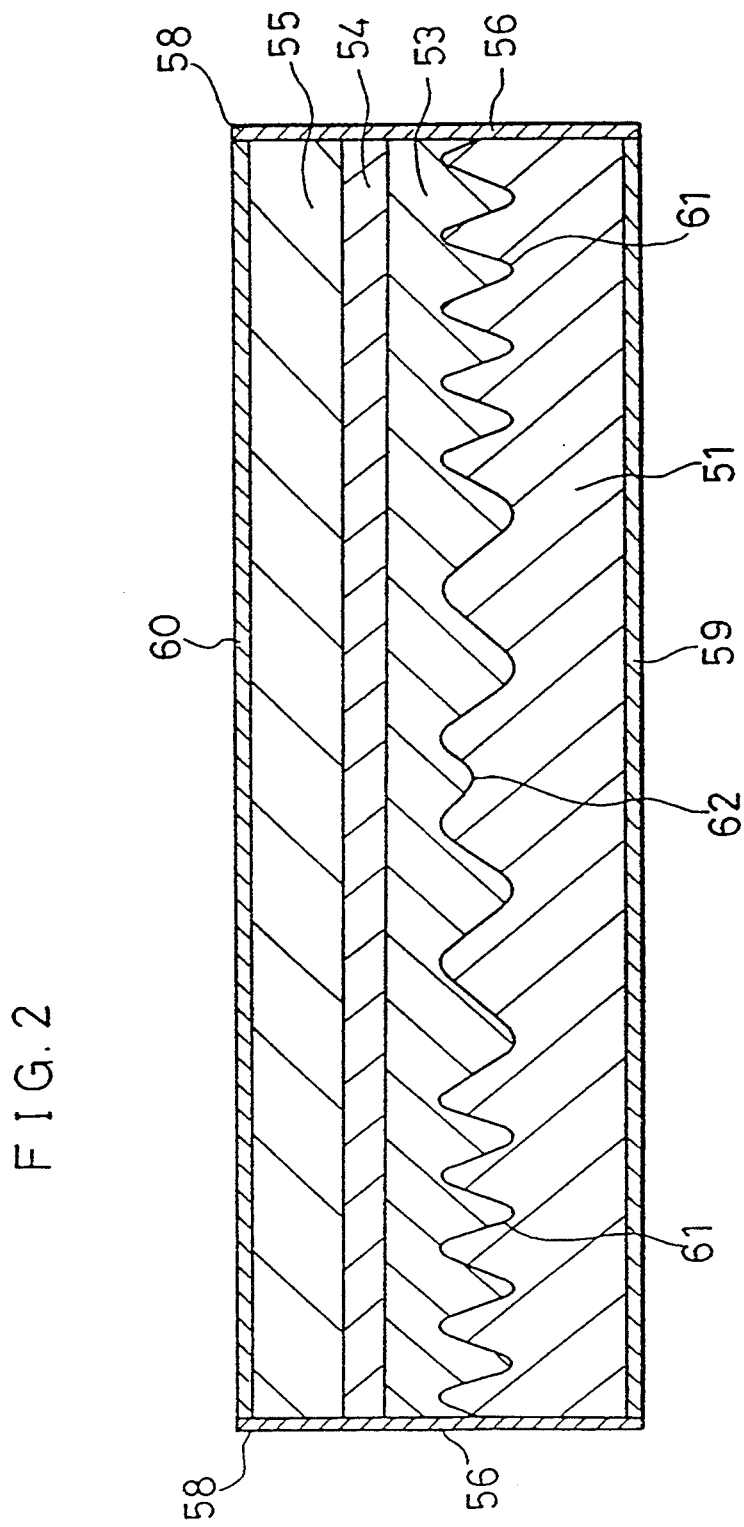
FIG. 2 is a cross-sectional view showing a single wavelength oscillating semiconductor laser device in accordance with a second embodiment of the present invention.

FIG. 2 is a cross-sectional view showing a single wavelength oscillating semiconductor laser device in accordance with a second embodiment of the present invention. In FIG. 2, an n-type InGaAsP guide layer 53, an InGaAsP active layer 54, and a p-type InP cladding layer 55 are sequentially disposed on an n-type InP substrate 51 where a primary diffraction grating 61 and a secondary diffraction grating 62 are present, the latter having a central phase shift region. An n side electrode 59 is disposed on a back surface of the substrate 51 and a p side electrode 60 is disposed on the p-type InP layer 55. A non-reflective coating film 58 is disposed on both facets 56 of the laser.

Light is more effectively reflected by a low ordered diffraction grating. Therefore, as shown in FIG. 2, when the order of the diffraction grating 62 in the center of the element is higher than that of the diffraction grating 61 in the neighborhood of resonator facets, i.e., when the period of the periodic structure 62 in the central part of the laser is larger than the period of the periodic structure 61 adjacent the facets 56, the reflection intensity of the light in the center of the element is less than that in the neighborhood of the resonator facets. As a result, the light generated at the active layer 54 is not confined to the center of the element. Most light advances to the neighborhood of the resonator facets and is reflected by the diffraction grating 61. Therefore, light intensity is not high only in the center of the element and can be uniform over the whole element with the result that hole melting is not likely to occur. Thus, a single wavelength oscillating semiconductor laser device having a high linearity between light output and injected current and high stability at a single wavelength oscillation is produced. In addition, the laser beam can be output perpendicular to the substrate by the secondary diffraction grating 62 in the laser device.

According to the conventional method for manufacturing the diffraction grating shown in FIG. 8, since a diffraction grating having a uniform period is present over the whole surface of the substrate, it is not possible to form a semiconductor laser having the primary and secondary diffraction gratings shown in FIG. 2.

According to a method for manufacturing a diffraction grating in accordance with the present invention, the diffraction grating having two different periods can be formed on the same plane surface in a single interference exposure.

Figure 3A:
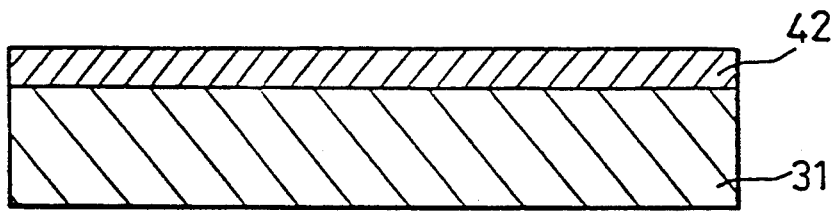
FIGS. 3(a), 3(b), 3(d) and 3(e) are cross-sectional views showing steps in manufacturing a diffraction grating in accordance with a third embodiment of the present invention
Figure 3B:
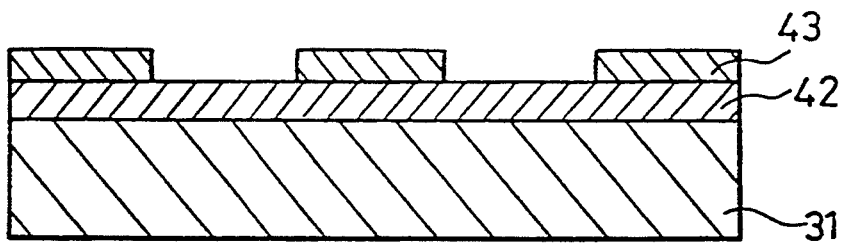
Figure 3C:
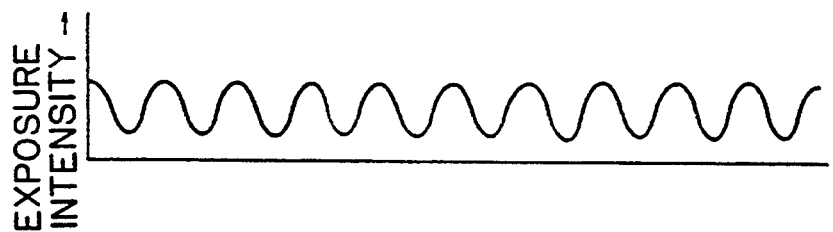
FIG. 3(c) is a diagram showing a distribution of exposure light intensity.
Figure 3D:
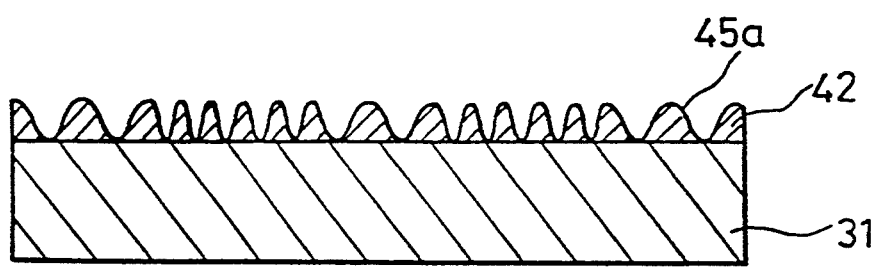
Figure 3E:
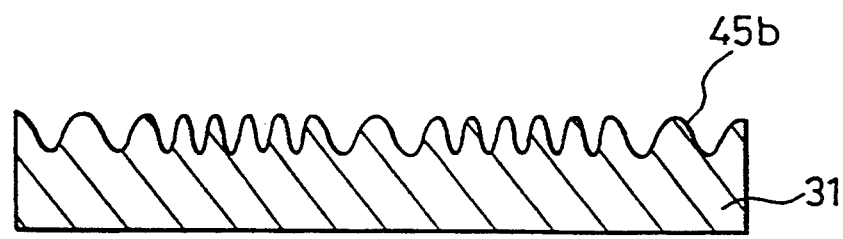

FIGS. 3(a), 3(b), 3(d), and 3(e) are cross-sectional views showing manufacturing steps of a diffraction grating in accordance with a third embodiment of the present invention and FIG. 3(c) is a diagram showing distribution of light intensity.

In FIG. 3(b), an image-reversible resist 42 that has a developing speed with a minimum value at a certain exposure light intensity is applied to a substrate 31. The image-reversible resist 42 is applied to the substrate 31 where the diffraction grating is to be formed and baked at a temperature of 110° to 120° C. before exposure so that the developing speed has a minimum value at a certain exposure light intensity. The resist is baked at a temperature of 110° to 120° C. for five minutes. Then, referring to FIG. 3(b), a semi-transparent mask 43 is disposed on parts of the resist 42. Using a two-beam interference exposure method, the resist 42 is exposed with an exposure light including interference fringes having maximum and minimum intensities higher and lower than the intensity producing the minimum exposure speed, in the portion of the resist 42 that is not covered by the semi-transparent mask 43. FIG. 3(c) is a diagram showing the distribution of the exposure light intensity. Then, referring to FIG. 3(d), the resist 42 is developed so that the resist 42 at portions exposed with the light intensity that makes the developing speed a minimum value is left and patterned to form a diffraction grating 45a. Then, referring to FIG. 3(e), the substrate 31 is etched away with an appropriate etchant such as an HBr/HNO$_3$/CH$_3$OH solution or a Br$_2$/CH$_3$OH solution using the patterned resist 42 as a mask to form a diffraction grating 45b.

As described above, when the image-reversible resist is exposed so that the maximum exposure light intensity is more than the intensity at which the developing speed has a minimum value (a point $\alpha$ in FIG. 5) and the minimum exposure light intensity is less than the intensity at point $\alpha$, the resist is developed so that the resist at portions exposed with the intensity that makes the developing speed a minimum is left. As a result, after etching, it is possible to form a diffraction grating having a period that is one-half the period of the interference fringe pattern of the exposure light.

Figure 4:
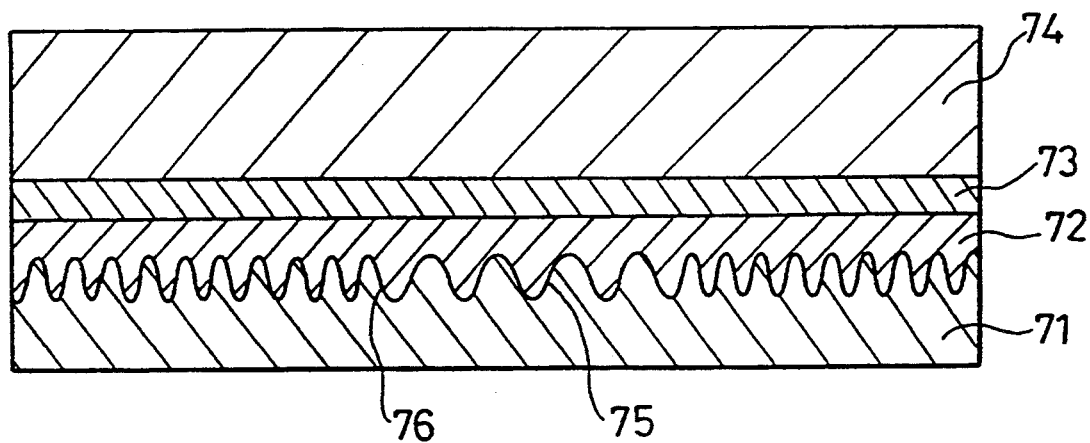
FIG. 4 is a cross-sectional view showing a semiconductor laser having a primary diffraction grating in the neighborhood of resonator facets and a secondary diffraction grating in the center of a resonator.

When the maximum value of the exposure light intensity using the interference exposure method is less than the intensity at point $\alpha$ or the minimum value of the exposure light intensity is more than the intensity at point $\alpha$, the resist has the same interference fringe pattern as the exposure light. Therefore, when a part of the substrate is covered with the semi-transparent mask, the maximum exposure light intensity in a portion not covered by the mask is more than the intensity at point $\alpha$, the minimum exposure light intensity is less than the intensity at point $\alpha$, and the maximum value of the exposure light intensity in a portion covered with the mask is less than the intensity at point $\alpha$, it is possible to form diffraction gratings having periods of $\Lambda$ and $\Lambda/2$ in a single exposure.

similar to the semiconductor laser shown in FIG. 2, the semiconductor laser shown in FIG. 4 comprises primary and secondary diffraction gratings 76 and 75, i.e., periodic structures, formed on a substrate 71 in which a phase shift region is not formed in the center of the secondary diffraction grating 75. Referring to FIG. 4, a p-type InGaAsP guide layer 72, an InGaAsP active layer 73, and an n-type InP cladding layer 74 are sequentially disposed on a p-type InP substrate 71 where the primary and secondary diffraction gratings 76 and 75 are located. Electrodes and coatings on facets are not shown.

The diffraction gratings are manufactured on the p-type InP substrate 71 instead of the substrate 31 shown in FIG. 3(a) in accordance with a flow shown in FIGS. 3(a), 3(b), 3(d), and 3(e). More specifically, referring to FIG. 3(a), the image-reversible resist on the substrate is baked at a temperature of 110° to 120° C. before exposure so that developing speed has a minimum value with regard to a certain exposure light intensity.

Referring to FIG. 3(b), part of the substrate is covered by the semi-transparent mask 43. The resist is exposed by the interference exposure method with an exposure light having larger and smaller intensities than the intensity that makes the developing speed a minimum in a portion of the resist not covered with the semi-transparent mask 43 and is exposed with an exposure light intensity in which the maximum intensity is less than the intensity that makes the developing speed a minimum value in the parts covered with the semi-transparent mask 43. The widths of the elements of the semi-transparent mask 43 and the distances between pairs of them are approximately 300 microns. Thereafter, the substrate is etched using an appropriate etchant to form the diffraction gratings 75 and 76. Then, the InGaAsP guide layer 72, the composition ratio of which pervides a band gap corresponding to a wavelength of 1.15 microns, the InGaAsP active layer 73, the composition ratio of which permits the layer to have a band gap corresponding wavelength of 1.3 microns, and the n-type InP cladding layer 74 are sequentially formed and then divided into chips in the center of the primary diffraction grating by cleaving. Thus, the DFB laser shown in FIG. 4 is completed.

Although a semiconductor laser having no phase shift region was described in the above embodiment, when a phase shift plate is introduced into the interference exposure apparatus, a phase shift region can be formed in the center of the element in accordance with the manufacturing method of the present invention. As a result, the semiconductor laser device shown in FIG. 2 can be manufactured.

In addition, although the diffraction grating with a period of $\Lambda$ is formed in a portion covered with the semi-transparent mask and a diffraction grating with the period of $\Lambda/2$ is formed in a portion not covered with the semi-transparent mask in the above embodiment, the same effect can be attained even if the whole surface of the resist on the substrate is exposed before or after the interference exposure so that the maximum value of the exposure light intensity is more than the intensity at point $\alpha$ and the minimum value is less than the point $\alpha$ in the portion covered with the semi-transparent mask and the minimum value of the exposure light intensity is more than the intensity at point $\alpha$ in the portion not covered with the mask.

As described above, according to the present invention, a method of manufacturing the diffraction grating comprises applying a resist, the developing speed of which has an extreme value for a certain exposure light intensity, to a substrate where the diffraction grating is to be formed, exposing the resist with interference fringes of light having intensities larger and smaller than the intensity that makes the developing speed an extreme value, and etching the substrate using a mask obtained by developing the resist. Thus, a diffraction grating pattern having a period that is one-half an interference fringe period of the interference light is formed.

In addition, according to the present invention, since the order of the diffraction grating in the center is higher than that of the diffraction grating in the neighborhood of resonator facets in a semiconductor laser device having the diffraction grating in an active region, light intensity is prevented from being increased in the center of the element and very high linearity between light output and injected current and high stability in single wavelength oscillation are obtained.

In addition, according to the present invention, the method for manufacturing the diffraction gratings comprises applying a resist, the developing speed of which has an extreme value at a certain exposure light intensity, to a substrate where the diffraction grating is to be formed, partially covering the resist with a semi-transparent mask, exposing the resist with interference fringes of light having intensities larger and smaller than the intensity that makes the developing speed an extreme value in either a portion covered with the semi-transparent mask or another portion, and etching the substrate using a mask obtained by developing the resist. As a result, two diffraction gratings having two different periods are simultaneously formed by one interference exposure and a semiconductor laser having primary and second diffraction gratings can be easily formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser including:
   a semiconductor substrate of a first conductivity type, a light guide layer of a first conductivity type disposed on and contacting the substrate, an active layer disposed on the on and contacting the substrate, an active layer disposed on the light guide layer, and a cladding layer of a second conductivity type, opposite the first conductivity type, disposed on the active layer; and
   first and second electrodes disposed on and in electrical contact with the substrate and the cladding layer, respectively, the semiconductor laser including first and second facets transverse to the light guide, active, and cladding layers, wherein thicknesses of one of the light guide, active, and cladding layers and one of an adjacent layer and the substrate vary so that first and second periodic structures are formed by an interface of the layer of varying thickness, the first periodic structure having a first period and being disposed remote from the first and second facets in a central part of the laser and the second periodic structure having a second period smaller than the first period, parts of the second periodic structure being disposed adjacent each of the first and second facets, sandwiching the first periodic structure.

2. The semiconductor laser of claim 1 wherein the first periodic structure includes a phase shift in the central part of the semiconductor laser.

* * * * *

UNITED STATES PATENT AND TRADEMARK OFFICE
CERTIFICATE OF CORRECTION

PATENT NO. :   5,386,433
DATED      :   January 31, 1995
INVENTOR(S):   Ohkura et al.

It is certified that error appears in the above-indentified patent and that said Letters Patent is hereby corrected as shown below:

Column 8, line 28, after "substrate," delete --an active--;

line 29, delete --layer disposed on the on and contacting the substrate,--.

Signed and Sealed this

Twenty-third Day of May, 1995

*Attest:*

BRUCE LEHMAN

*Attesting Officer*       *Commissioner of Patents and Trademarks*